(12) United States Patent
Glocker et al.

(10) Patent No.: US 6,551,477 B2
(45) Date of Patent: Apr. 22, 2003

(54) INTERLOCKING CYLINDRICAL MAGNETRON CATHODES AND TARGETS

(75) Inventors: David A. Glocker, Rush, NY (US); Mark Romach, Spencerport, NY (US)

(73) Assignee: Isoflux, Inc., Henrietta, NY (US)

( * ) Notice: Subject to any disclaimer, the term of this patent is extended or adjusted under 35 U.S.C. 154(b) by 0 days.

(21) Appl. No.: 09/961,652

(22) Filed: Sep. 24, 2001

(65) Prior Publication Data

US 2002/0041158 A1 Apr. 11, 2002

Related U.S. Application Data

(60) Provisional application No. 60/235,276, filed on Sep. 25, 2000.

(51) Int. Cl.[7] ............................................... C23C 14/34
(52) U.S. Cl. ........................... 204/298.21; 204/298.22; 204/192.12
(58) Field of Search ..................... 204/298.21, 298.22, 204/192.12

(56) References Cited

U.S. PATENT DOCUMENTS

| | | | |
|---|---|---|---|
| 3,884,793 A | 5/1975 | Penfold et al. | |
| 3,995,187 A | 11/1976 | Penfold et al. | |
| 4,030,986 A | 6/1977 | Shinskey | |
| 4,031,424 A | 6/1977 | Penfold et al. | |
| 4,041,353 A | 8/1977 | Penfold et al. | |
| 4,111,782 A | 9/1978 | Penfold et al. | |
| 4,116,793 A | 9/1978 | Penfold et al. | |
| 4,116,794 A | 9/1978 | Penfold et al. | |
| 4,132,612 A | 1/1979 | Penfold et al. | |
| 4,132,613 A | 1/1979 | Penfold et al. | |
| 5,178,743 A | 1/1993 | Kumar | |
| 5,228,963 A | 7/1993 | Rose | |
| 5,437,778 A | 8/1995 | Hedgcoth | |
| 5,529,674 A | 6/1996 | Hedgcoth | |

FOREIGN PATENT DOCUMENTS

DE 197 23 050 C2 6/2001

*Primary Examiner*—Rodney G. McDonald
(74) *Attorney, Agent, or Firm*—Neal L. Slifkin; Harris Beach LLP

(57) ABSTRACT

A cylindrical magnetron having a cylindrical cathode surrounding a cylindrical target. The cathode is without features extending inwards thereof at either end such that the target may be axially removed from or installed into the cathode from either end. The target is positioned and axially retained within the cathode by resilient means operative between the outer surface of the target and the inner surface of the cathode. The invention is especially useful in magnetron assemblies having a plurality of abutting, coaxially disposed magnetrons, wherein all the targets may be removed and replaced from the cathode assembly without requiring disassembly and reassembly of the cathodes.

10 Claims, 5 Drawing Sheets

INTERLOCKING CYLINDRICAL MAGNETRON CATHODES AND TARGETS

RELATIONSHIP TO OTHER APPLICATIONS

The present application draws priority from the filing date of U.S. Provisional Application Serial No. 60/235,276, filed Sep. 25, 2000 by David A. Glocker and Mark Romach.

FIELD OF THE INVENTION

The present invention relates to apparatus for sputter coating of substrates; more particularly, to such apparatus wherein the sputtering target is cylindrical; and most particularly to such apparatus wherein cylindrical targets may be inserted into, operationally retained in, and removed from the surrounding cylindrical cathodes without disassembly of the cathodes.

BACKGROUND OF THE INVENTION

Cylindrical magnetron sputtering is a useful method for coating three-dimensional complex shapes, such as those used for cutting and forming tools, biomedical devices, optical fibers and so on. Cylindrical magnetron sputtering devices have been described in a series of patents, including U.S. Pat. Nos. 3,884,793; 3,995,187; 4,030,986; 4,031,424; 4,041,353; 4,111,782; 4,116,793; 4,116,794; 4,132,612; 4,132,613; 5,178,743; 5,228,963; 5,437,778; and 5,529,674; all of which are incorporated herein by reference.

Prior art cylindrical magnetrons use a variety of means to create traps for the secondary electrons produced by ion bombardment that are responsible for maintaining the sputtering plasma. Some plasma traps are formed by axial magnetic fields working together with electrostatic wings on the cathode and/or target. Alternatively, the magnetic field and each individual electrode may define other kinds of traps. A variety of examples of such traps are described in the reference patents.

One important advantage of cylindrical magnetrons is that they can use targets that are simple cylinders that slide into a cylindrical cathode body. Therefore, no clamping or bolting is needed to assure that good thermal contact is made between the target and cathode body. As the target temperature rises, the target increases in diameter and clamps more tightly to the water-cooled cathode jacket that surrounds it. In this way a self-limiting temperature is reached as long as an adequate flow of cooling water is maintained. In prior art cylindrical magnetrons, the target is located with respect to the cathode body and held in place by clamps in the ends of the cathode or by flange(s).

It is sometimes advantageous to operate multiple individual cylindrical magnetron cathodes in a single chamber. For example, it may be desirable to have targets of different materials that can be sputtered independently using separate power supplies. Or, in some cases, it is useful to operate two electrically isolated targets with an alternating current power supply in the mid-frequency or radio frequency range. See, for example, the 43$^{rd}$ Annual Technical Conference Proceedings of the Society of Vacuum Coaters, "AC Reactive Sputtering with Inverted Cylindrical Magnetrons," pp. 81–85.

In prior art cylindrical magnetron assemblies having two or more electrically independent cathodes and targets, flanges and clamps typically are used to locate and hold the targets axially within the cathodes. Prior art configurations require that when multiple targets are used that they be installed and removed from both ends of the cathode body. This is very inconvenient, particularly if one end of a cathode body is sealed directly to the vacuum system, as is sometimes the case.

It is a primary object of the invention to provide cylindrical targets that mate with corresponding cylindrical magnetron cathodes, wherein multiple targets may be easily installed from one end of a cathode assembly.

It is a further object of the invention to allow easy removal and installation of targets within a single cylindrical magnetron cathode without the need to remove any fasteners.

It is a still further object of the invention to provide mating cylindrical magnetron targets and cathodes that minimize the area of surfaces subject to the unwanted buildup of sputtered material during the coating process.

SUMMARY OF THE INVENTION

Briefly described, a cylindrical magnetron has a cylindrical cathode surrounding a cylindrical target. The cathode is unfeatured at each end, as by a target-supportive flange, such that the target may be removed from or installed into the cathode from either end. The target is positioned and axially retained within the cathode by resilient means operative between the outer surface of the target and the inner surface of the cathode. The invention is especially useful in magnetron assemblies having a plurality of abutting, coaxially disposed magnetrons, wherein all the targets may be removed and replaced from the cathode assembly without requiring disassembly and reassembly of the cathodes.

BRIEF DESCRIPTION OF THE DRAWINGS

The foregoing and other objects, features, and advantages of the invention, as well as presently preferred embodiments thereof, will become more apparent from a reading of the following description in connection with the accompanying drawings in which.

DETAILED DESCRIPTION OF THE INVENTION

Figure 1:
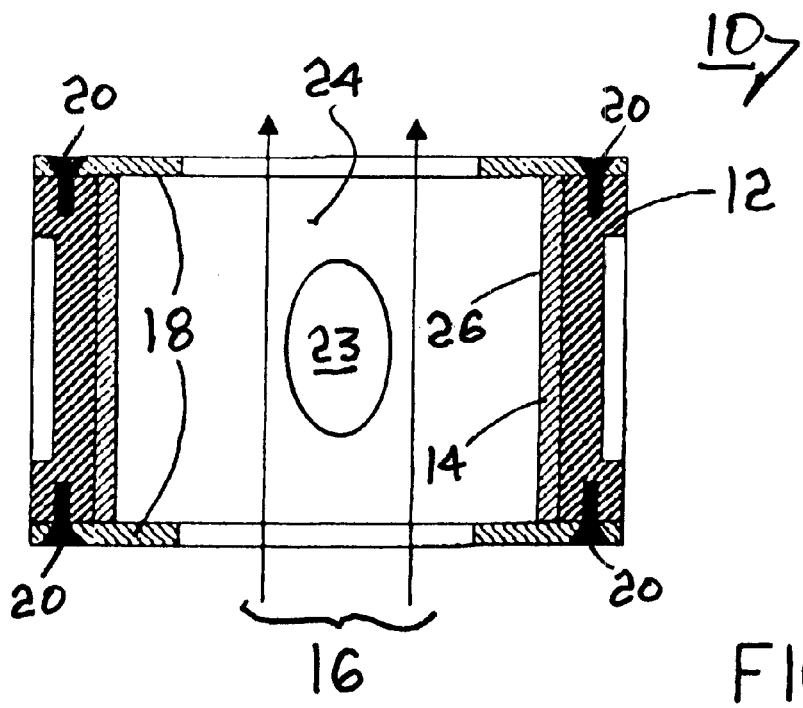
FIG. 1 is a cross-sectional view of a prior art cylindrical magnetron wherein the cylindrical target is held in place within the cylindrical cathode by removable flanges that extend inboard of the target-surface at either end.

FIG. 1 shows a cylindrical magnetron 10 as disclosed in the prior art. The cathode body 12 is a cylinder, typically having a water cooling channel or other cooling means (not shown). A sputtering target 14 is cylindrical in shape and has an outer diameter slightly less than the inner diameter of body 12 such that target 14 can be easily inserted into the cathode body 12 by simply sliding it into place. An axial magnetic field 16 is produced by conventional means (not shown) external to the cathode body, as is well known in the art. Wings 18 are flanges which serve two purposes: they locate and support the target within the cathode, and they form part of a plasma trap that permits sputtering. Wings 18 are at the target voltage and cooperate with axial magnetic field 16 to produce the plasma trap in what is well known in the art as hollow cathode confinement. The wings may be separate flanges 18 which are attached to body 12 as by bolts 20. The objects 23 to be coated, for example, wires, fibers, cutting tools, optical elements, and the like, are placed within the interior 24 of the cathode body/target assembly 10. By applying a voltage to the cathode body/target 10 in the presence of a sputtering gas at the proper gas pressure, a plasma is produced that bombards the inner surface 26 of target 14 and produces a sputtered coating of target material on objects 23. Also not shown are the vacuum pumps, vacuum chamber, gas flow equipment and other means of producing a vacuum coating environment around the cathode, which will be easily inferred by those skilled in the art. The configuration of wings and the means for connecting them to the cathode body may take various forms, but they always extend inboard of the inner target surface in order to confine the plasma. Therefore, in this or related prior art configurations, the wings must be removed to replace or change the target material. This step requires time and the fabrication of the wings and the mounting method, which adds to the cost and complexity of the device.

Figure 2:
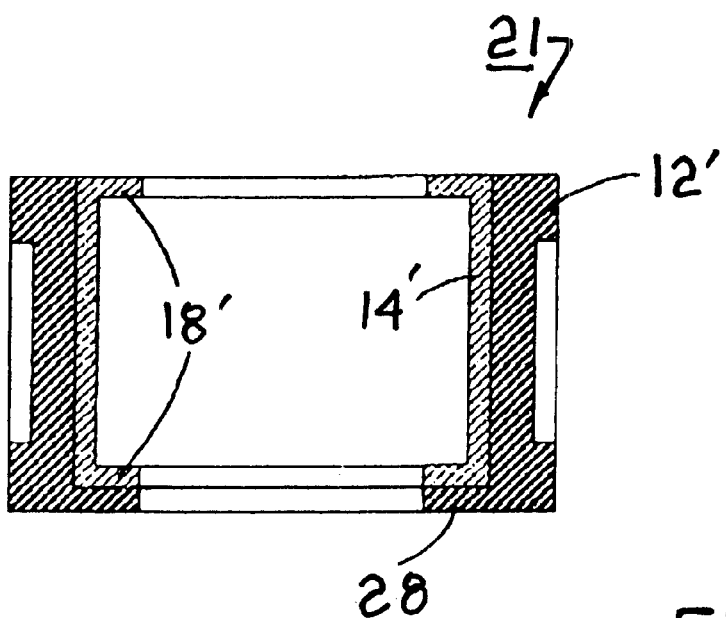
FIG. 2 is a cross-sectional view of a prior art cylindrical magnetron wherein the cylindrical target is held in place within the cylindrical cathode by a flange integral with the cathode, the target also having inwardly extending electrostatic flanges, or "wings," for confining the plasma over the surface of the target.

Referring to FIG. 2, an alternative prior art configuration 21 has wings 18' incorporated at the ends of the target 14' that serve as the means for plasma confinement. In this way there is no need to have wings attached to the cathode body 12' and the target 14' can simply slide in and out of the cathode body without removing any parts. However, a small flange 28 on the cathode body is needed to support the target against gravity and/or positively locate the target in this configuration. Furthermore, the wings 18' can increase the cost of fabricating the target significantly. They require complicated shaping, often of materials that are difficult to machine.

Figure 3:
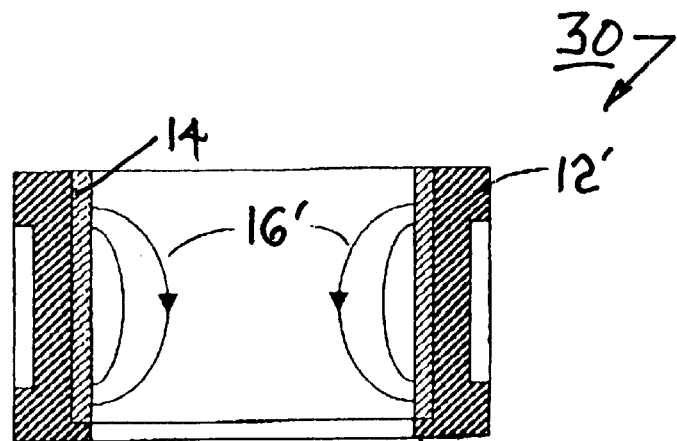
FIG. 3 is a cross-sectional view of a prior art cylindrical magnetron wherein the cylindrical target is absent the confining "wings" shown in FIG. 2.

FIG. 3 shows another configuration 30 of a prior art cylindrical magnetron that eliminates the need for wings in a cylindrical magnetron sputtering device. As is well known in the art, cylindrical magnetrons do not require hollow cathode confinement with wings to operate. The cathode body 12' has a flange 28 similar to flange 28 shown in FIG. 2. However, the magnetic field lines 16' form a closed plasma trap that is produced by magnets (not shown) external to the cathode body. This type of trap is well known in planar magnetron sputtering and is described in the prior art of cylindrical magnetrons as well. This field configuration requires no wings at the ends of the target for plasma confinement, although erosion of the target surface is axially non-uniform. Therefore, the target can be a simple cylinder, like target 14 in FIG. 1, that simply slides into place within the cathode and is thus easy and inexpensive to fabricate. However, some means of locating and supporting the target is still necessary, such as flange 28.

Figure 4:
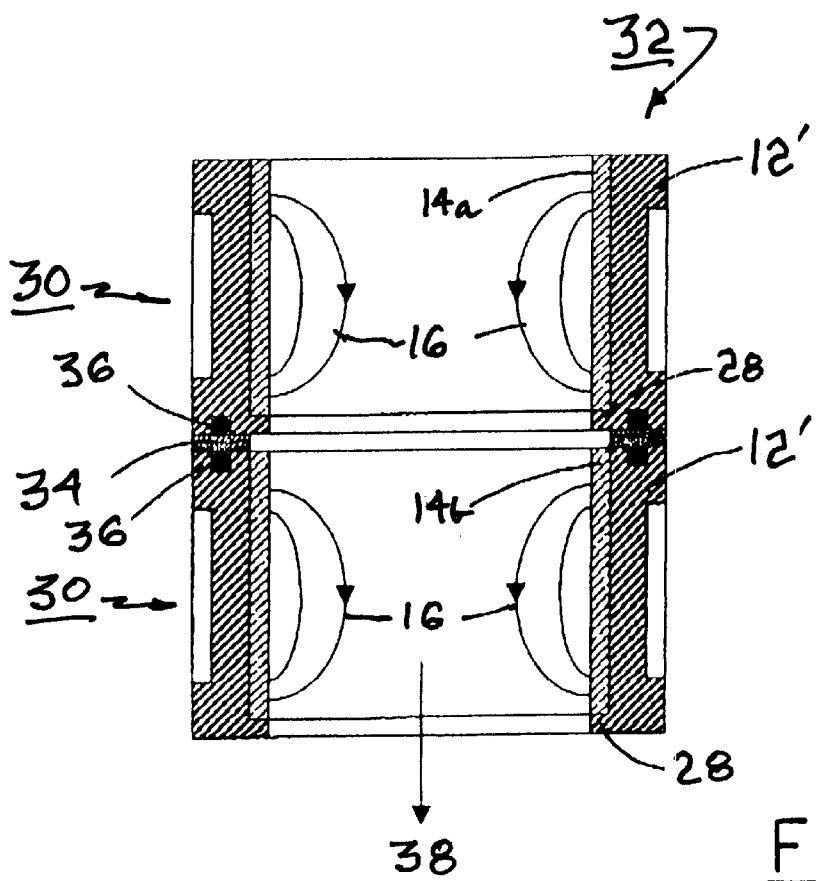
FIG. 4 is a cross-sectional view of a prior art cylindrical magnetron having a plurality of cathodes and targets axially assembled.

In some cases, such as when co-sputtering two materials or when reactively sputtering with mid-frequency AC power, it is necessary to use an assembly 32 comprising two coaxial cylindrical magnetrons, for example, two such magnetrons 30, as shown for the prior art in FIG. 4. Furthermore, it may be desirable to make the two independent cathodes part of a single vacuum-tight assembly. Two cathode bodies 12' are electrically isolated from each other by an insulating material 34 that is also vacuum tight. Preferably, the cathode bodies are sealed to the insulating material 34 with O-rings 36. Furthermore, in some prior art designs the cathode assembly is mounted directly on a pumping system 38, making the cathodes the vacuum vessel itself, rather than placing the cathodes inside another vacuum chamber. When the cathodes 12' are assembled as shown in FIG. 4, target 14a can be easily removed but target 14b cannot be removed because of flange 28 on the upper cathode. In such cases, in order to change the targets the cathode bodies must be separated from one another or removed from the pumping system 38. Often these cathodes are large, up to more than a foot in diameter, making them heavy and awkward to move. Furthermore, the process of disassembling and reassembling them is time-consuming and requires breaking vacuum seals, which creates the possibility of subsequent vacuum leaks.

One prior art way of dealing with this disadvantage is to make the cathodes of different diameters, with correspondingly different target diameters, so that the small target is installed by being passed through the larger cathode. However, this increases the complexity of the multiple cathode system and eliminates the advantage of using common parts for the different cathodes and targets.

Figure 5:
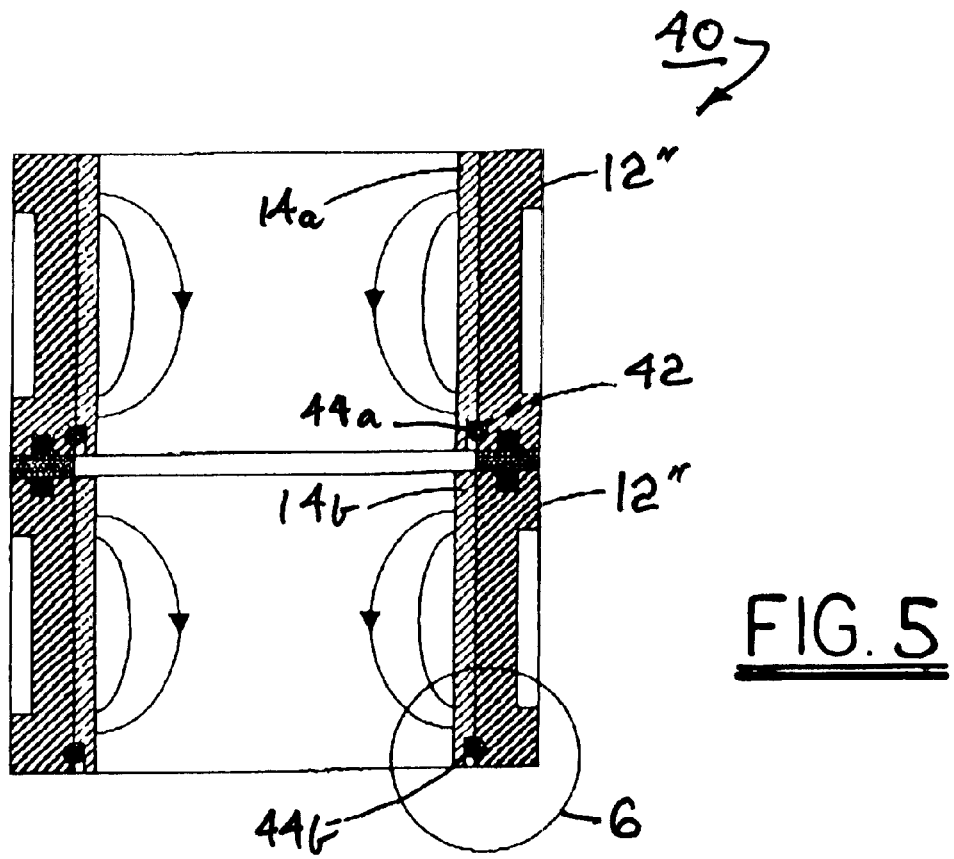
FIG. 5 is a cross-sectional view of a cylindrical magnetron in accordance with the invention having a plurality of cathodes and targets axially assembled.
Figure 6:
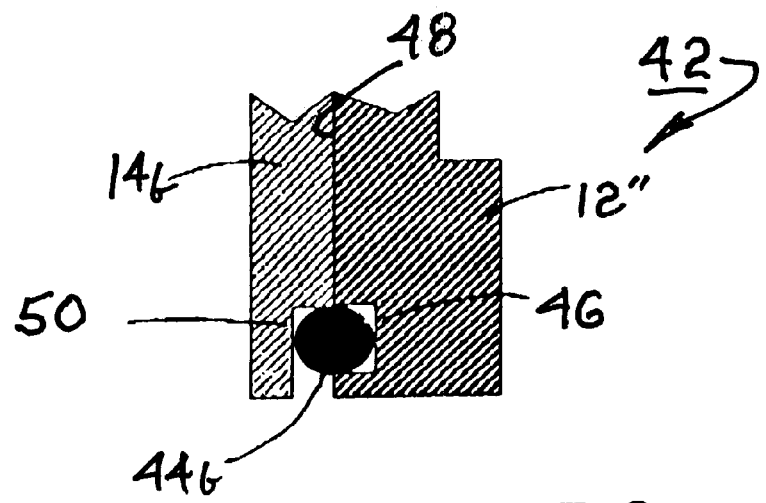
FIG. 6 is an enlarged view taken within circle 6 in FIG. 5.

It is very desirable to be able to remove all of the targets by simply passing them through cathodes that are of the same diameter and aligned with one another, without the need to disassemble the cathodes. In accordance with the invention, FIGS. 5 and 6 show a dual magnetron assembly 40 having first means 42 for allowing the targets 14a, 14b to be removed from both cathode bodies in a simple way without requiring the separation of the cathode bodies or removing them from the pumping system. A retaining element 44a,b, which may be an internal design retaining ring or internal housing ring, and which can be easily removed, fits into an annular groove 46 formed in the inner wall 48 of each cathode body 12", which cathode bodies are otherwise smooth on their inner surfaces and lack flanges 28 found on prior art cathodes. A mating step 50 in target 14b locates the target axially with respect to the cathode body and supports it against gravity. This design is repeated in upper cathode body 12", upper target 14a, and upper retaining element 44a. To remove the lower target 14b, the upper target 14a is first removed and the upper retaining element 44a in the upper cathode body 12" is also removed. Lower target 14b can then be lifted out of the assembly without the need to disconnect the cathode bodies or break any vacuum seals. In this embodiment, the upper retaining element functions analogously to flange 28 in the prior art but is readily removable without disassembly of the cathode structure.

Instead of a snap ring or spiral retaining ring, retaining elements 44a,b may be elastomeric 0-rings that compress in grooves 46 sufficiently for the targets to slide past them and yet provide enough radial force to positively locate the targets and support them. Alternatively, elements 44a,b may be annular springs made from stainless steel or other suitable material.

Of course, it should be understood that groove 46 for retaining elements 44a,b may be formed just as well in the outer wall of the target rather than the inner wall of the cathode, to the same effect.

Figure 7:
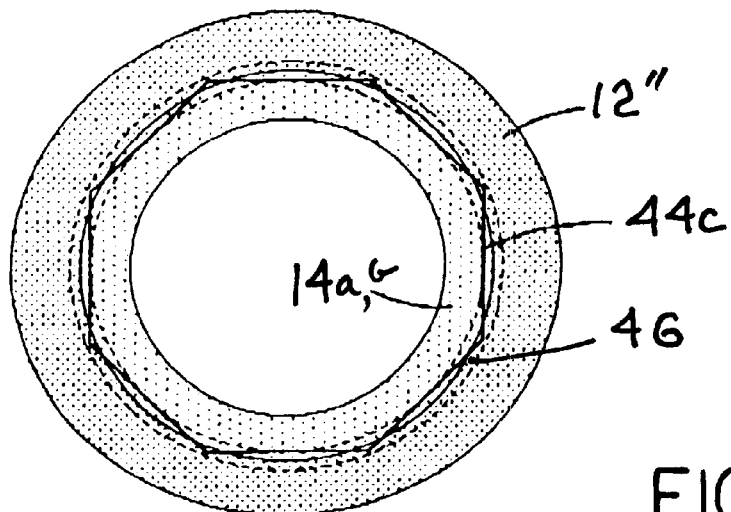
FIGS. 7, 8, 9, and 10 show other embodiments of means for positioning and retaining a cylindrical target within a cylindrical cathode in accordance with the invention.

Furthermore, retaining elements 44a,b need not be circular in cross-section or in profile. For example, FIG. 7 illustrates another embodiment 44c. In this top view of cathode body 12'' and target 14a or 14b, a multi-sided wire hoop 44c (shown as a solid line for clarity) rests in a groove 46 in the cathode body and supports target 14a or 14b. Hoop 44c may be more easily removed than a conventional snap ring or O-ring.

Figure 8:
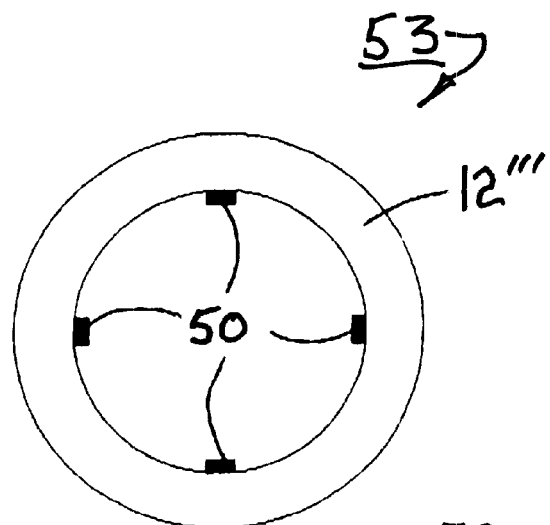
Figure 9:
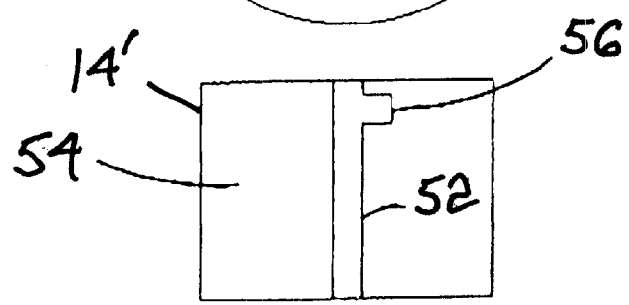

FIGS. 8 and 9 show yet another means 53 for positioning and retaining the target within the cathode body as taught by the invention. Cathode body 12''' is provided with at least one and preferably a plurality of jig buttons 50 that extend a short distance inwardly of cathode inner surface 48. Target 14' (shown in elevation in FIG. 9) is provided with at least one groove 52, and preferably the same number of grooves 52 as buttons 50, formed in the outer surface 54 of target 14' for matably engaging with buttons 50 when the target is inserted into the cathode body. Each of grooves 52 is formed with a circumferential slot 56 on its side, such that when the target is passed through the cathode body buttons 50 line up with slots 56. The target may then be rotated in bayonet fashion to force buttons 50 into slots 56 to lock the target axially and radially in place within the cathode body. The buttons and corresponding grooves can be made very small so that the reduction in useful target thickness is minimized. Furthermore, the impact on target cooling of such small grooves is negligible.

Of course, it is to be understood that the buttons may be formed on the outer surface of the target and the grooves formed on the inner surface of the cathode, to equivalent effect.

Figure 10:
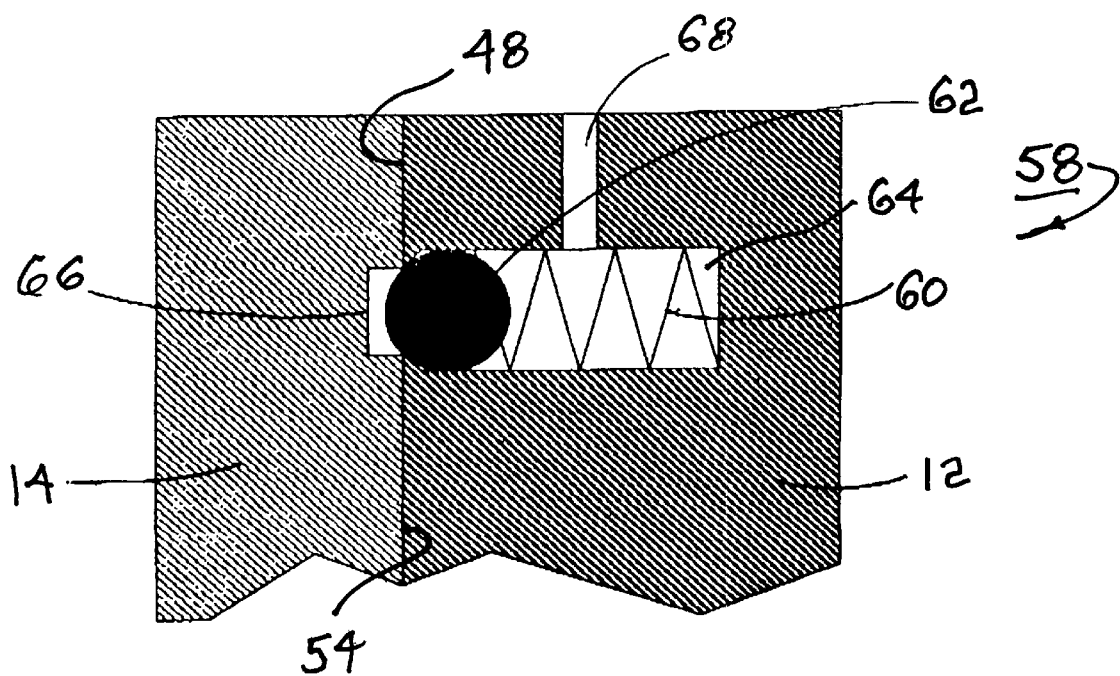

Still another possible means 58 for positioning and releasably retaining a target within a cathode body in accordance with the invention includes an arrangement of spring-loaded plungers or balls. FIG. 10 shows such an arrangement. A compression spring 60 and ball 62 are recessed and captured in a radial bore 64 formed in the inner wall 48 of the cathode body 12. Preferably, identical arrangements are provided at a plurality of radial locations. Mating dimples 66 in the outer surface 54 of the target provide the locating and support mechanisms. A vent hole 68 allows gas to enter or escape from the bore as the ball moves radially. This same method can be used with commercial devices, commonly known as Vlier plungers.

From the foregoing description it will be apparent that there has been provided an improved cylindrical magnetron assembly for sputter deposition of target material on a substrate, wherein a cylindrical target or targets may be installed into or removed from a cylindrical cathode body or bodies without disassembly of the cathode assembly. Variations and modifications of the herein described cylindrical magnetron apparatus, in accordance with the invention, will undoubtedly suggest themselves to those skilled in this art. Accordingly, the foregoing description should be taken as illustrative and not in a limiting sense.

PARTS LIST 10 first prior art cylindrical magnetron
12 cathode body
14 target
16 magnetic field
18 wings, flanges
20 bolts
21 second prior art cylindrical magnetron
22 flanges
23 objects to be coated
24 interior of 10
26 inner surface of 14
28 flange
30 third prior art cylindrical magnetron
32 prior art dual magnetron assembly
34 insulator
36 O-rings
38 pumping system
40 improved dual magnetron assembly
42 firt means
44 retaining elements
46 grooves
48 cathode inner surface
50 jig buttons
52 groove in 54
53 second means
54 outer surface of 14'
56 slot
58 third means
60 spring
62 ball
64 bore
66 dimples
68 vent

What is claimed is:

1. A cylindrical magnetron, comprising:

a) a cylindrical cathode having a cylindrical inner surface;

b) a cylindrical target having a cylindrical outer surface and being disposed within said cylindrical cathode; and c) means operative between said target and said cathode for positioning and retaining said target axially within said cathode, wherein said means for positioning and retaining includes a groove in said inner surface of said cathode, a first resilient element disposed in said groove and extending resiliently inwards of said inner surface, and a step formed in said outer surface of said target at an end thereof for receiving said resilient element to position and support said target axially within said cathode, and wherein the diameter of said target at all diameters of said outer surface is less than the diameter of said cathode at all diameters of said inner surface, such that said target may be passed axially entirely through said cathode.

2. A cylindrical magnetron in accordance with claim 1 wherein said first resilient element is selected from the group consisting of elastomeric O-ring, annular spring, retaining ring, housing ring, and multi-sided wire hoop.

3. A cylindrical magnetron in accordance with claim 1 wherein said means for retaining comprises:

a) at least one button extending from one of said inner surface of said cathode and said outer surface of said target;

b) at least one longitudinal groove formed in one of said inner surface of said cathode and said outer surface of said target for matably receiving said button when said target is inserted into said cathode; and c) a slot extending at an angle from said longitudinal groove for receiving said button when said target is rotated within said cathode, to position and retain said target axially of said cathode.

4. A cylindrical magnetron in accordance with claim 1 wherein said means for retaining comprises:

a) at least one bore in said cathode opening through said inner surface thereof;

b) a second resilient element disposed in said bore and extending resiliently inwards of said inner surface; and c) a dimple formed in said outer surface of said target for receiving an engaging end of said second resilient element to position and support said target axially within said cathode.

5. A cylindrical magnetron in accordance with claim 4 wherein said second resilient element includes a compression spring and a ball.

6. A cylindrical magnetron in accordance with claim 1 wherein said cylindrical target has an inner cylindrical surface and further comprises electrostatic wings extending inwards of said inner cylindrical surface.

7. A cylindrical magnetron in accordance with claim 1 wherein said means for positioning and retaining comprises:
   a) a groove in said outer surface of said target;
   b) a first resilient element disposed in said groove and extending resiliently outwards of said outer surface; and
   c) a step formed in said inner surface of said cathode at an end thereof for receiving said resilient element to position and support said target axially within said cathode.

8. A cylindrical magnetron assembly having a plurality of individual cylindrical magnetrons abutting coaxially, each of said individual magnetrons comprising:
   a) a cylindrical cathode having a cylindrical inner surface;
   b) a cylindrical target having a cylindrical outer surface and being disposed within said cylindrical cathode, wherein the diameter of said target at all diameters of said outer surface is less than the diameter of said cathode at all diameters of said inner surface, such that said target may be passed axially entirely through said cathode; and
   c) means operative between said target and said cathode for positioning and retaining said target axially within said cathode, said means including a groove in said inner surface of said cathode, a first resilient element disposed in said groove and extending resiliently inwards of said inner surface, and a step formed in said outer surface of said target at an end thereof for receiving said resilient element to position and support said target axially within said cathode.

9. A cylindrical magnetron assembly in accordance with claim 8 wherein outer diameters of said cylindrical targets are identical and wherein inner diameters of said cylindrical cathodes are identical and greater than said outer diameters of said cylindrical targets.

10. A cylindrical magnetron assembly in accordance with claim 8 wherein all of said plurality of cylindrical targets are insertable into and removable from said plurality of cylindrical cathodes from one end of said magnetron assembly.

* * * * *